United States Patent [19]

Beck et al.

[11] Patent Number: 4,684,765

[45] Date of Patent: Aug. 4, 1987

[54] BUS ASSEMBLY AND METHOD OF MAKING SAME

[75] Inventors: Lawrence R. Beck, Girard; Andrew J. Kocjan, Niles; Richard A. Natoli, Girard; Louis J. Liguore, Poland, all of Ohio

[73] Assignee: General Motors Corporation, Detroit, Mich.

[21] Appl. No.: 846,880

[22] Filed: Apr. 1, 1986

[51] Int. Cl.$^4$ .......................... H05K 1/00; H05K 13/00
[52] U.S. Cl. ..................................... 174/68.5; 29/850; 361/406; 439/43
[58] Field of Search ....................... 174/68.5; 361/406; 339/18 R, 18 B, 18 C; 29/850, 857

[56] References Cited

U.S. PATENT DOCUMENTS

| | | | |
|---|---|---|---|
| 2,478,274 | 8/1949 | Johnson | 339/18 R |
| 2,958,926 | 11/1960 | Morison | 29/838 |
| 3,277,347 | 10/1966 | Ecker | 361/419 |
| 3,374,305 | 3/1968 | Bower | 174/68.5 |
| 3,771,102 | 11/1973 | Murray et al. | 339/19 |
| 3,850,492 | 11/1974 | Moore | 339/18 R |
| 3,895,181 | 7/1975 | La Grange et al. | 339/18 R X |
| 4,290,661 | 9/1981 | Burns | 339/18 R |
| 4,387,509 | 6/1983 | Dechelette | 29/850 |
| 4,412,715 | 11/1983 | Bogese, II | 339/97 P |

Primary Examiner—Morris M. Nimmo
Attorney, Agent, or Firm—F. J. Fodale

[57] ABSTRACT

An electrical connector assembly includes a bus assembly which comprises a bus insulation plate having a base which includes a plurality of terminal stations and a plurality of guide stations. The terminal stations and guide stations are separated from each other so as to provide a network of wire channels which communicate with wire passages which extend through the terminal and guide stations. The terminal stations also have terminal cavities which extends through the base to intersect the wire passages. The bus assembly further includes electrical busses comprising lengths of electrically conductive wire which pass through various terminal and guide stations via the network of wire channels.

14 Claims, 13 Drawing Figures

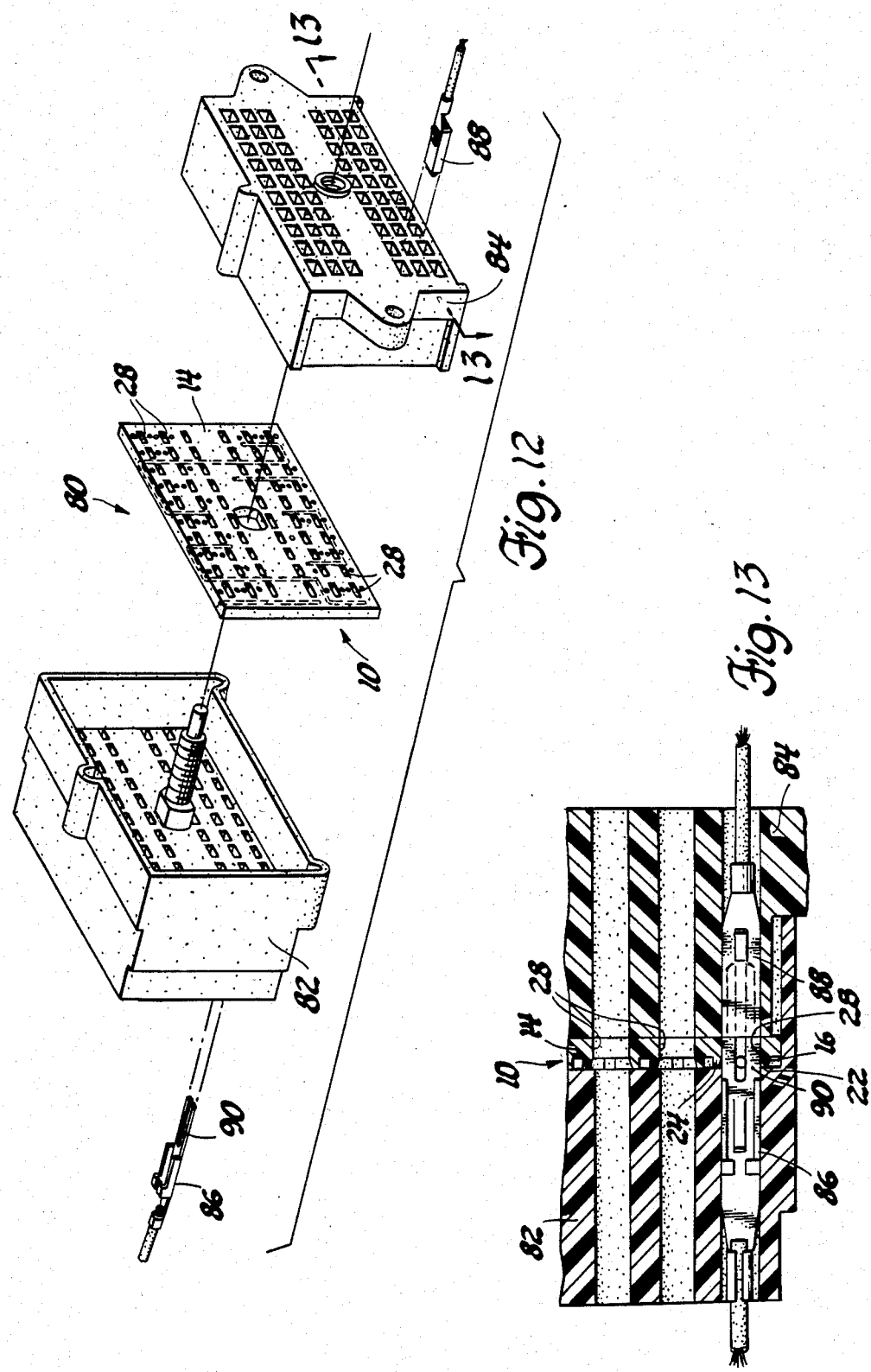

BUS ASSEMBLY AND METHOD OF MAKING SAME

This invention relates to a bus assembly and more particularly, to a bus assembly comprising a bus insulation plate and one or more bus conductors of various lengths and configurations and to a method of manufacturing such a bus assembly.

The object of this invention is to provide a bus assembly and a method of manufacturing a bus assembly which has a great deal of flexibility in changing bussing patterns.

Another object of this invention is to provide a bus assembly and a method of manufacturing a bus assembly which use a bus insulation plate and ordinary solid core conductor wire to provide a seemingly infinite variety of bus assemblies.

Another object of this invention is to provide a bus assembly and a method of manufacturing a bus assembly in which bussing patterns are easily changed with a minimum of tooling change.

Other objects and features of the invention will become apparent to those skilled in the art as the disclosure is made in the following detailed description of a preferred embodiment of the invention as illustrated in the accompanying sheets of drawing in which:

FIG. 12 is an exploded perspective view of an electrical connector assembly which incorporates the bus assembly shown in FIGS. 1 and 2.

FIG. 13 is a section taken substantially along the line 13—13 of FIG. 12 looking in the direction of the arrows with the parts in their assembled position.

Figure 1:
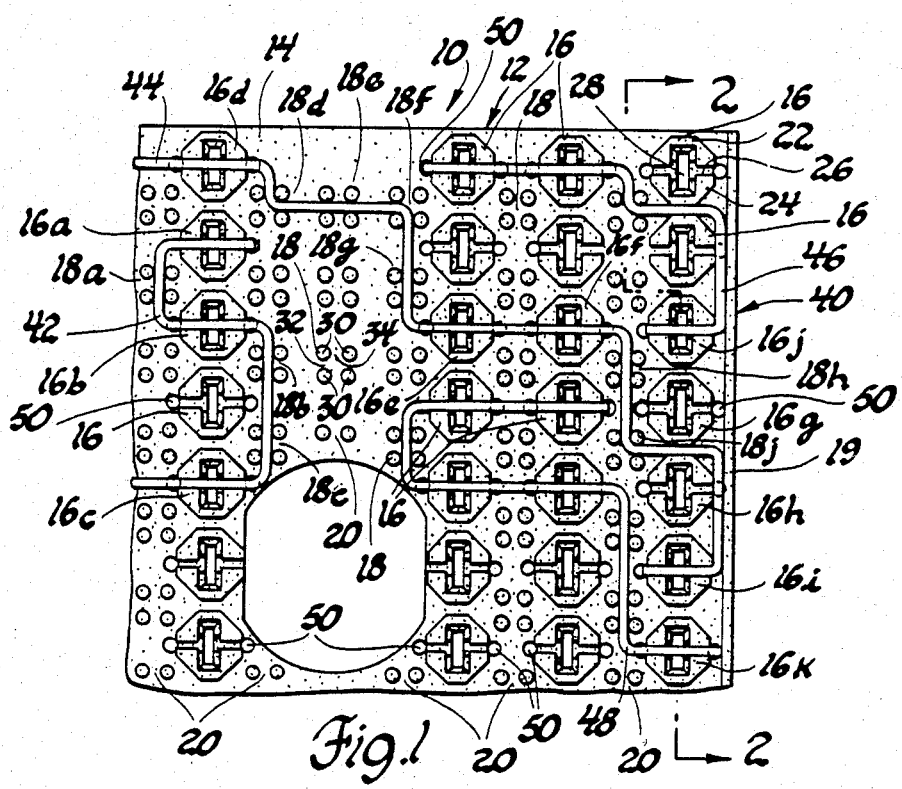
FIG. 1 is a plan view of a bus assembly in accordance with this invention.
Figure 2:
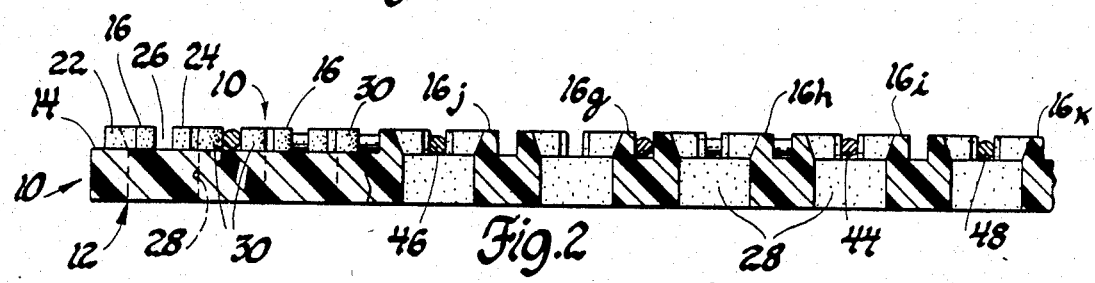
FIG. 2 is a transverse section of the bus assembly taken along the line 2—2 of FIG. 1 looking in the direction of the arrows.

Referring more to the drawing and more particularly, to FIGS. 1 and 2, the bus assembly 10 comprises a bus insulation plate 12 comprising a base 14 which has a plurality of terminal stations 16, 16a, 16b..., a plurality of guide stations 18, 18a, 18b, etc., and an end wall 19.

The terminal stations 16, etc., and the guide stations 18, etc., are separated from each other so as to provide a network of wire channels 20 which separate each station from every other station so that a conductor wire may pass between each station and every other station. The network of wire channels 20 also includes a wire channel between the stations and the end wall 19 so that a conductor wire may pass between the stations and the end wall.

The terminal stations 16, etc., are octagon shaped and include a pair of spaced islands 22,24 which define a wire passage 26 which communicates with the network of wire channels 20, and a terminal cavity 28 which extends through the base 14 and the pair of spaced islands 22,24 to intersect the wire passage 26.

The guide stations 18, etc., are square shaped and include a plurality of projections 30 (i.e. one at each corner of the square) which define a pair of intersecting wire passages 32, 34, each of which communicates with the network of wire channels 20.

The terminal stations 16, etc., are in a first rank and file arrangement and the guide stations 18, etc., are in a second rank and file arrangement wherein at least one file of guide stations 18, etc., (the vertical rows of guide stations as viewed in FIG. 1) is interposed between adjacent files of the terminal stations 16, etc., (the vertical rows of terminal stations as viewed in FIG. 1).

The ranks of the guide stations 18, etc., (the horizontal rows of guide stations as viewed in FIG. 1) are between the ranks of the terminal stations 16, etc., (the horizontal rows of terminal stations as viewed in FIG. 1) so that the guide stations are in a diagonal arrangement with the terminal stations.

The files (vertical rows) of the terminal stations 16, etc., are widely spaced so that the file (vertical row) or files of the guide stations 18, etc., are separate and do not overlap the files of the terminal stations 16, etc., to facilitate bending electrically conductive wires, such as the electrically conductive wires 42, 44, 46 and 48, at right angles. On the other hand, the ranks (horizontal rows) of the terminal stations 16, etc., are compressed with just enough room for a conductor wire to pass between adjacent terminal stations to conserve space.

The wire passages 34 of the guide stations 18, etc., are substantially perpendicular to the wire passages of the terminal stations 16, etc., to facilitate guiding the wire from a terminal station in one rank to a terminal station in another rank.

On the other hand, the wire passages 32 of the guide stations 18, etc., are substantially parallel to the wire passages of the terminal stations 16, etc., to facilitate guiding the wire between the compressed ranks of the terminal stations 16, etc., or across wide expanses.

The bus assembly 10 further comprises an electrical busing means 40 comprising the aforementioned plurality of electrically conductive wires 42, 44, 46, 48 of various lengths and configurations, typically lengths of 20 gauge solid core copper wire. It should be understood that the four conductive wires 42, 44, 46 and 48 are for illustrative purposes only and that the number, length and configuration of the conductive wires can vary greatly. However, all the electrically conductive wires such as the electrically conductive wires 42, 44, 46 and 48 pass through at least two terminal stations 16, etc., and a portion of the network of wire channels 20. Moreover, as a practical matter, the electrically conductive wires usually pass through several terminal stations 16, etc., as well as one or more guide stations 18, etc., which are used in directing the electrically conductive wire from one terminal station to another.

For instance, the electrically conductive wire 42 passes through terminal station 16a and then through guide station 18a which in reversing direction of the wire 42 and directing the wire 42 into the terminal station 16b immediately below. The electrically conductive wire 42 then passes from the terminal station 16b through two guide stations 18b and 18c which are used again in reversing the direction of the wire 42 and directing the wire 42 into the terminal station 16c spaced below. The electrically conductive wire 42 then passes through the terminal station 16c and continues on to other guide stations and terminal stations not shown.

Another example of the variety available from a single length of wire is illustrated by the electrically conductive wire 44 which comes through terminal station 16d and then passes through four guide stations 18d, 18e, 18f and 18g which are used in guiding the wire 44 across the wide space to the next file of terminal stations and down two ranks to the terminal station 16e. The electrically conductive wire 44 then passes through two terminal stations 16e and 16f in a rank (horizontal row) and thence, through two guide stations 18h and 18j in a file (vertical row) and thence between two terminal stations 16g and 16h and thence between the terminal station 16h and the end wall 19 and thence through terminal station 16i.

Other examples of variety are illustrated by the electrically conductive wires 46 and 48. The electrically conductive wire 46 passes through two typical terminal stations 16 across from each other in adjacent files, then passes through a typical guide station 18, then passes between two terminal stations 16 in the next file (vertical row) and then around the one of lower rank and then through the terminal station 16j one rank below. The electrically conductive wire 48 passes through two typical terminal stations 16 across from each other in adjacent files, then passes through a typical guide station 18, and then back through two terminal stations across from each other in the rank below. The electrically conductive wire 48 then passes through two guide stations in a file and then through the terminal station 16k one file over.

The wire passages 26 of the terminal stations 16, etc., have end portions which are preferably slightly narrower than the diameter of the electrically conductive wire forming the bus means 40 so that the electrically conductive wires 42, 44, 46, and 48 are force fit into the terminal stations 16, etc., along their path. The wire passages 32, 34 of the guide stations 18, etc., are also preferably slightly narrower than the wire but the force fit of the wire need not be as great.

The bus insulation plate 12 also has a plurality of holes 50 extending through the base 14 and intersecting the network of wire channels 20 at the entrances of the wire passages 26 of the terminal stations 16, etc., for receiving cut ends of the electrically conductive wires 42, 44, 46, and 48 as explained more fully below.

Figure 9:
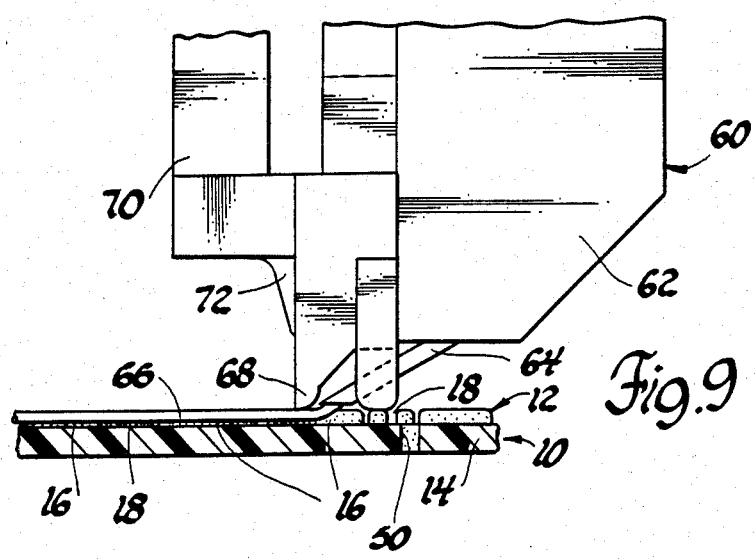
Figure 10:
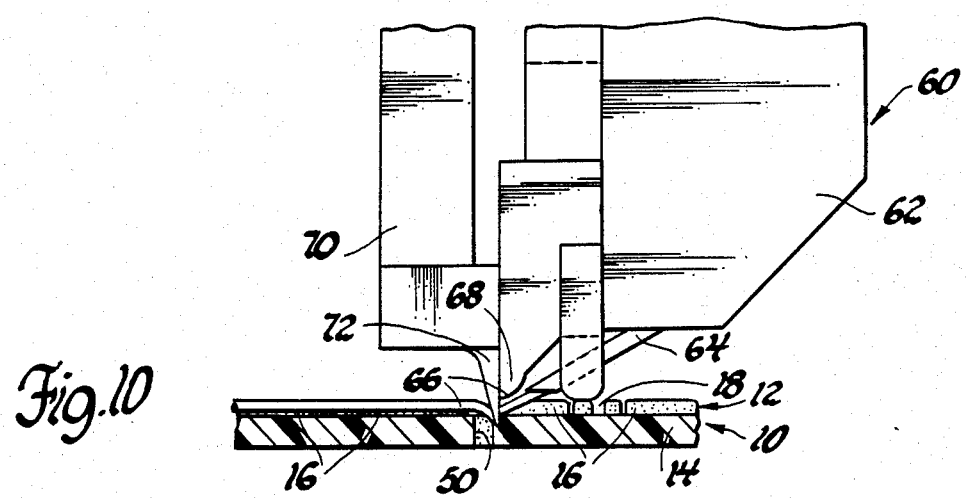
Figure 11:
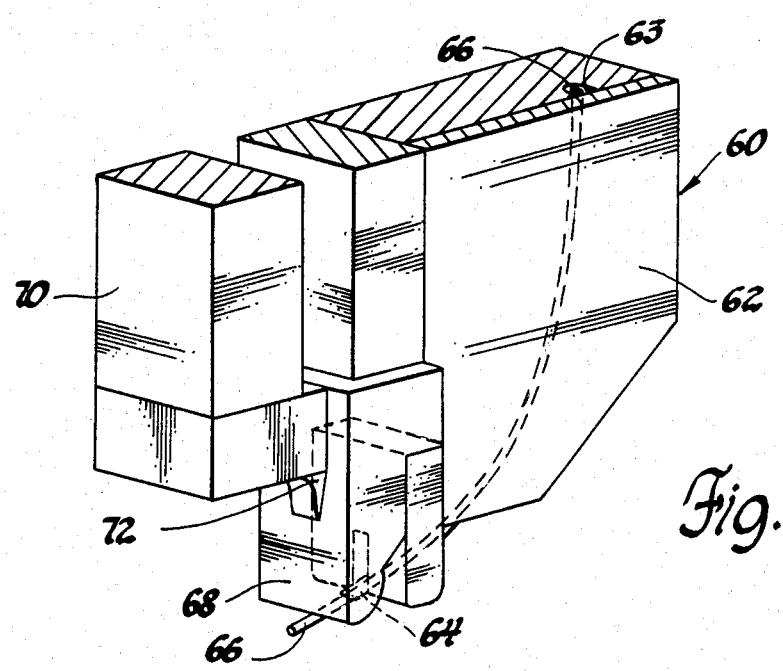
FIG. 11 is a perspective view showing of the assembly head shown in FIGS. 5 through 10.

Referring now to FIGS. 5 through 11, an assembly machine processor head 60 for making the bus assembly 10 by applying an electrical conductor wire or wires to the bus insulation plate 12 is shown. The machine processor head 60 is mounted on a ram head (not shown) which moves the machine processor head 60 from a raised position, shown in FIGS. 5 and 6 to the lowered operative position shown in FIGS. 8 through 10. Referring momentarily to FIG. 11, the machine processor head 60 comprises a wire payout head 62 which includes a wire guide channel 63 leading to an angularly disposed, wire feed tube 64 which feeds wire 66 from a storage reel (not shown) of the assembly machine to the bus insulation plate 12 and a planting finger 68 which engages and pushes the wire 66 being paid out from the wire feed tube 64 into the wire channels and passages of the bus plate 12. The machine processor head 60 further comprises a cutter slide 70 which has a wedge shaped cutter blade 72 which slides up and down the planting finger 68.

The bus plate 12 affixed to X-Y ball screw tables (not shown) translates in two directions so that the machine processor head 60 can cover the entire surface of the bus plate 12 and the payout head 62 also rotates on its vertical axis so that the wire 66 being paid out by the payout head 62 can be turned 90 degrees as the wire 66 is being set in a given pattern through the terminal stations 16 and guide stations 18 by the X-Y ball screw tables and machine processor head 60. The X-Y ball screw tables and the machine processor head 60 including the machine payout head 62 and cutter slide 70 are computer controlled by means of suitable software which issues the commands necessary for cutting and laying the requisite lengths of wire 66 in the patterns necessary to form the electrical conductor wires 42, 44, 46 and 48 described above.

Figure 5:
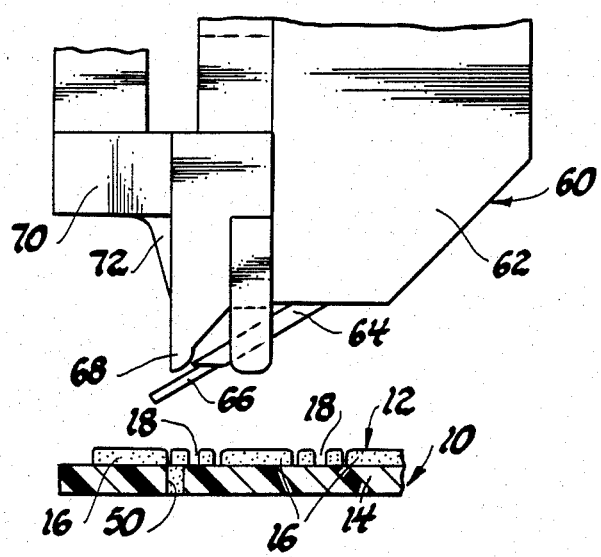
FIG. 5 is a side view of an assembly head for applying a conductor wire to the bus insulation plate of the bus assembly shown in FIGS. 1 and 2.

More specifically, the bus assembly 10 is manufactured by clamping or otherwise suitably fixing the bus insulation plate 12 in position on the X-Y tables beneath the computer controlled machine processor head 60. The processor head 60 is then properly positioned over a selected hole 50 through the bus plate base 14 and a predetermined length of conductor wire 66 is paid out at an acute angle of about 30 degrees to the horizontal until the conductor wire 66 extends past the planting finger 68 and the selected hole 50 as shown in FIG. 5.

Figure 6:
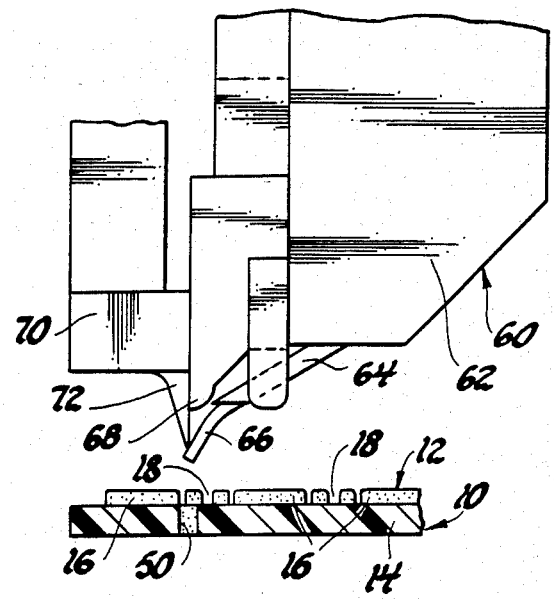
FIGS. 6 through 10 are side views of the assembly head showing various stages of applying the conductor wire to the bus insulation plate of the bus assembly shown in FIGS. 1 and 2.

The cutter slide 70 is then lowered on the still raised processor head 60 so that the cutter blade 72 engages the leading end of the paid out conductor wire 66 and bends the leading end downwardly toward a vertical position as shown in FIG. 6.

Figure 7:
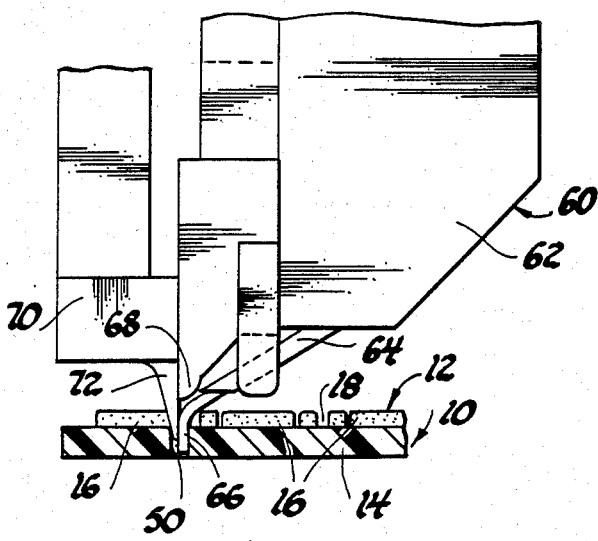
Figure 8:
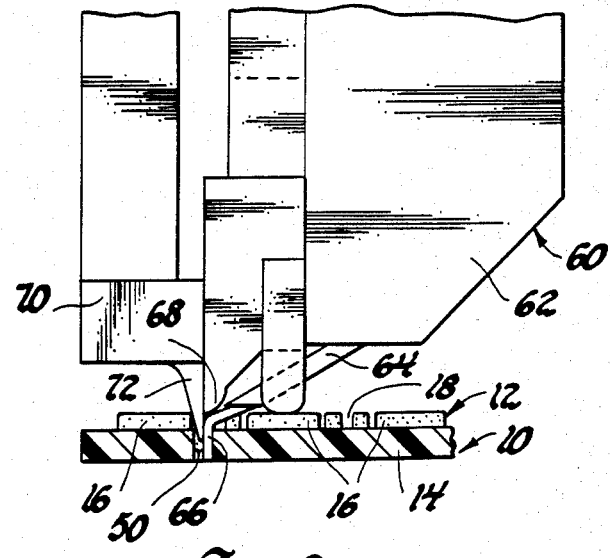

The processor head 60 is then lowered to plant the bent leading end of the conductor wire 66 in the hole 50. As the processor head descends, the cutter blade 72 pushes the bent leading end of the conductor wire 66 into the hole 50 and continues to bend the leading end of the conductor wire 66 until it is held against the side of the hole 50 as shown in FIG. 7. The planting finger 68 is then lowered to engage the conductor wire 66 and bend it around the edge of the hole 50 so that the leading end of the conductor wire 66 is substantially perpendicular and firmly planted in the hole 50 as shown in FIG. 8.

The cutter slide 70 is then raised and the fully lowered processor head 60 is then translated along the surface of the bus insulation plate 12 (by movement of the bus insulation plate on the X-Y ball screw tables) and intermittently rotated on its vertical axis in a predetermined pattern as the conductor wire 66 is paid out and planted by the planting finger 68 in a given pattern through the terminal stations 16 and guide stations 18 as shown in FIG. 9 to form one of the electrical conductor wires 42, 44, 46 and 48 shown in FIGS. 1 and 2.

When the processor head 60 reaches the end of the pattern for forming a particular electrical conductor wire for the busing means, the electrically conductive wire 66 is paid out past another selected hole 50 through the bus insulation plate 12 and the cutter slide 70 is lowered to shear the conductor wire 66 and bend the cut-off trailing end of the conductor wire 66 down into the hole 50 and the plastic base 14 adjacent the hole 50 as shown in FIG. 10. Thus, each end of the conductor wire 66 is firmly planted in the base 14 of the bus insulation plate 12 so that the ends of the conductor wire 66 will not work up later.

The above steps are repeated until each of the electrical conductor wires 42, 44, 46 and 48 are assembled to the bus insulation plate 12. Of course, the computer commands can be changed to add, delete or alter the configuration of the conductor wires. In fact a seemingly infinite variety of bus assemblies 10 are available simply by changing the computer software.

Referring now to FIGS. 12 and 13, there is shown a typical automotive bulkhead electrical connector assembly 80 in which the bus plate assembly 10 of this invention has been incorporated. The electrical connector assembly 80 comprises a plug housing 82 mounted on an automotive bulkhead or firewall (not shown) and a mating socket housing 84 which is plugged into the plug housing 82 with the bus plate assembly 10 disposed therebetween. The housings 82 and 84 are provided with means for bolting the housings together because several electrical connections and consequently high mating forces are typically involved.

The electrical connector assembly 80 further includes electrical blade terminals 86 which are housed in the plug housing 82 and mating female electrical terminals 88 which are housed in socket housing 84. The terminals 86, 88 are attached to the ends of electrical conductors which typically are part of a large wiring harness. In any event, the electrical terminal 86 which is representative of the several electrical terminals which are housed in the socket housing 82 includes a forward slotted blade 90 which projects through one of the terminal stations 16, 16a, 16b, etc., of the bus assembly 10 as shown in FIG. 5. The slotted blade 90 projects through the terminal cavity 28 which extends through the base 14 and the pair of spaced islands 22,24 and so that the electrically conductive wire in the intersecting wire passage 26 is received in the slot of the slotted blade 90 to establish an electrical connection. The end of the slotted blade 90 projecting beyond the bus assembly 10 is disposed in the plug connector 84 where it mates with a tyical female terminal 88 therein. In this way, the mated electrical terminals 86 and 88 are bussed to other blade terminals 86 in the plug housing 82 and their mating female terminals 88 in the socket housing 84.

Figure 3:
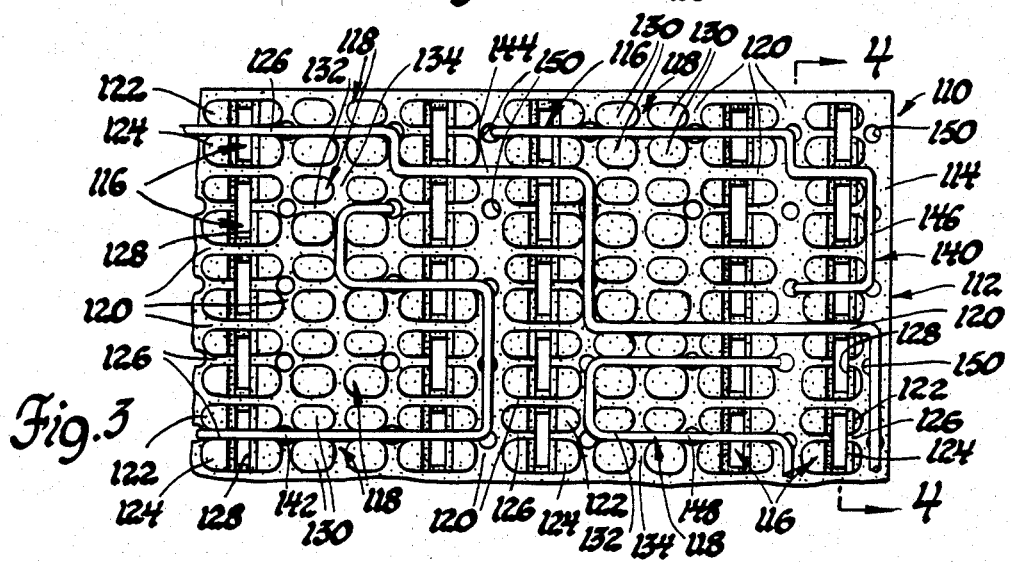
FIG. 3 is a plan view of a bus assembly in accordance with a second embodiment of this invention.
Figure 4:
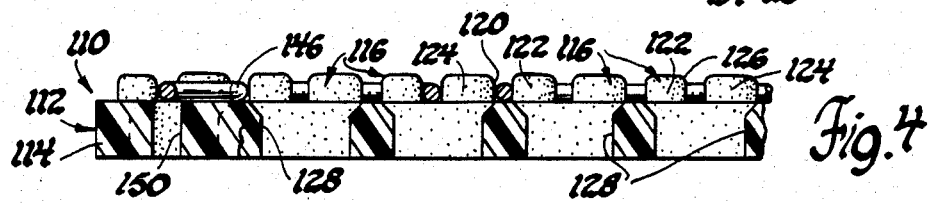
FIG. 4 is a transverse section of the bus assembly taken along the line 4—4 of FIG. 3 looking in the direction of the arrows.

Referring now to FIGS. 3 and 4, a bus assembly 110 in accordance with a second embodiment of this invention is shown.

The bus assembly 110 comprises a bus insulation plate 112 comprising a base 114 which has a plurality of terminal stations 116 and a plurality of guide stations 118. The terminal stations 116 and the guide stations 118 are separated from each other so as to provide a network of wire channels 120 which separate each station from every other station so that a wire may pass between each station and every other station.

The terminal stations 116 are rectangulary shaped and include a pair of spaced islands 122, 124 which define a wire passage 126 which communicates with the network of wire channels 120 and a terminal cavity 128 which extends through the base 114 and the pair of spaced islands 122, 124 to intersect the wire passage 126. The terminal cavities 128 may also divide the spaced islands 122, 124 into four ovals at the corners of each respective terminal station 116.

The guide stations 118 are also rectangularly shaped and include a plurality of oval shaped projections 130 (i.e. one at each corner of the rectangle) which define a pair of intersecting wire passages 132, 134, each of which communicates with the network of wire channels 120.

The terminal stations 116 are in a first rank and file arrangement and the guide stations 118 are in a second rank and file arrangement wherein files of guide stations 118 (the vertical rows of guide stations 118 as viewed in FIG. 3) are interposed between files of the terminal stations 116 (the vertical rows of terminal stations 116 as viewed in FIG. 3) and wherein the ranks of the guide stations 118 (the horizontal rows of guide stations 118 as viewed in FIG. 3) are aligned with the ranks of the terminal stations 116 (the horizontal rows of terminal stations 116 as viewed in FIG. 3) so that the guide stations 118 and the terminal stations 116 are in a checker board like arrangement. There is enough room for a wire to pass between adjacent stations in each rank and each file so that the stations in this checker board like arrangement are outlined by the network of wire channels 120 which form an open rectangular grid.

The wire passages 134 of the guide stations 118 are substantially perpendicular to the wire passages 126 of the terminal stations 116 to facilitate guiding the wire from a terminal station in one rank to a terminal station in another rank. On the other hand the wire passages 132 of the guide stations 118 are substantially parallel to and aligned with the wire passages 126 of the terminal stations 116 to facilitate guiding the wire from a terminal station in one file to a terminal station in another file.

The bus assembly 110 also comprises an electrical busing means 140 comprising a plurality of elecrically conductive wires 142, 144, 146 and 148 of various lengths and configurations, typically lengths of 20 gauge solid core copper wire. As before, the four conductive wires 142, 144, 146 and 148 are for illustrative purposes only and the number, length and configuration of the conductive wires can vary greatly. However, as pointed out above, all the electrically conductive wires such as the electrically conductive wires 142, 144, 146 and 148 pass through at least two terminal stations 116 and a portion of the network of wire channels 120 and, as a practical matter, the electrically conductive wires usually pass through several terminal stations 116 as well as one or more guide stations 118 which are used in directing the electrically conductive wire from one terminal station 116 to another.

The wire passages 126 of the terminal stations 116 are preferably slightly narrower than the diameter of the electrically conductive wire forming the busing means 140 so that the wires 142, 144, 146, 148 are force fit into the terminal stations along their path. The wire passages 132, 134 of the guide stations are also preferably slightly narrower than the wire but the force fit of the wire need not be as great.

The bus insulation plate 112 also has a plurality of holes 150 extending through the base 114 and intersecting the network of wire channels 120 at the entrances of the wire passages 126 of the terminal stations 116 for planting, the leading and trailing ends of the electrically conductive wires 142, 144, 146, 148 as explained above in connection with the manufacture of the first embodiment. This second embodiment is made in the same way by an assembly machine having the processor head 60 described above. Of course, the computer software would be modified to take the modified bus insulation plate 112 into account.

We wish it to be understood that we do not desire to be limited to the exact details of construction shown and described, for obvious modifications will occur to a person skilled in the art.

The embodiments of the invention in which an exclusive property or privelege we claim are defined as follows:

1. A bus assembly comprising:
   a bus insulation plate comprising a base having a plurality of terminal stations and a plurality of guide stations,
   said terminal stations and said guide stations being separated from each other so as to provide a network of wire channels which separate each station from every other station so that an electrically conductive wire may pass between each station and every other station,
   each of said terminal stations including a pair of spaced islands defining a first wire passage which communicates with the network of wire channels and a terminal cavity which extends through the base and the pair of spaced islands to intersect the first wire passage,
   each of said guide stations including a plurality of projections defining a second wire passage which communicates with the network of wire channels, and
   electrical busing means for conveying electrical current comprising an electrically conductive wire which passes through the first wire passage of at least two terminal stations and a portion of the network of wire channels.

2. The bus assembly as defined in claim 1 wherein the base has a plurality of holes extending through the base and intersecting the network of wire channels at entrances of the first wire passages of the terminal stations for receiving the ends of the electrically conductive wire.

3. The bus assembly as defined in claim 2 wherein the terminal stations are in a first rank and file arrangement and the guide stations are in a second rank and file arrangement in which files of guide stations are interposed between files of the terminal stations.

4. The bus assembly as defined in claim 3 wherein the second wire passages of the guide stations are substantially perpendicular to the first wire passages of the terminal stations and wherein the guide stations have third wire passages which intersect the second wire passages and which are substantially parallel to the first wire passages of the terminal stations.

5. The bus assembly as defined in claim 4 wherein the ranks of the guide stations are between the ranks of the terminal stations so that the guide stations are in a diagonal arrangement with the terminal stations.

6. The bus assembly as defined in claim 4 wherein the ranks of the guide stations are aligned with the ranks of the terminal stations so that the guide stations and terminal stations are in a checker board like arrangement.

7. A bus assembly comprising:
   a bus insulation plate comprising a base having a plurality of terminal stations in a first rank and file arrangement and a plurality of guide stations in a second rank and file arrangement wherein at files of guide stations are interposed between files of the terminal stations,
   said terminal stations and said guide stations being separated from each other so as to provide a network of wire channels which separate each station from every other station so that an electrically conductive wire may pass between each station and every other station,
   each of said terminal stations including a pair of spaced islands defining a first wire passage which extends in the rank direction of the terminal stations and which communicates with the network of wire channels, and a terminal cavity which extends through the base and the pair of spaced islands to intersect the first wire passage,
   each of said guide stations including a plurality of projections defining a pair of intersecting second and third wire passages each of which communicates with the network of wire channels and
   electrical busing means for conveying electrical current comprising a plurality of electrically conductive wires, each of which passes through the first wire passage of at least two terminal stations and a portion of the network of wire channels and at least one of which passes through the second or third wire passage of one of the guide stations.

8. The bus assembly as defined in claim 7 wherein the base has a plurality of holes extending through the base and intersecting the network of wire channels at entrances of the first wire passages of the terminal stations for receiving cut ends of the electrically conductive wires.

9. The bus assembly as defined in claim 8 wherein the second wire passages of the guide stations are substantially perpendicular to the first wire passages of the terminal stations and the third wire passages of the guide stations are substantially parallel to the first wire passages of the terminal stations.

10. A method of manufacturing a bus assembly comprising a bus plate and a bus means for conveying electrical current comprising at least one electrically conductive wire, comprising the steps of
    providing a bus plate having a base which includes a plurality of terminal stations and a plurality of guide stations which are separated from each other so as to provide a network of wire channels which separate each station from every other station so that a wire may pass between each station and every other station,
    each of said terminal stations including a pair of spaced islands defining a first wire passage which communicates with the network of wire channels and a terminal cavity which extends through the base and the pair of spaced islands to intersect the first wire passage,
    each of said guide stations including a plurality of projections defining second wire passages which communicate with the network of wire channels,
    paying out a length of electrically conductive wire and,
    planting the electrically conductive wire which is being paid out onto the base of the bus plate so that it passes through the first wire passages of at least two terminal stations and a portion of the network of wire channels to provide a bus means for terminals disposed in the two terminal stations, respectively.

11. The method as defined in claim 10 wherein the bus plate has a plurality of holes extending through the base and intersecting the network of wire channels at entrances of the wire passages of the terminal stations and wherein the leading and trailing ends of the electrically conductive wire are each planted in the base of the bus insulation plate in or adjacent to one of the holes.

12. The method of defined in claim 13 wherein the leading end of the electrically conductive wire is planted in one of the holes by;
    paying out a predetermined length of the electrically conductive wire at an angle to the bus plate until it extends past the hole, bending the leading end of the electrically conductive wire downwardly and inserting it in the hole, and then bending the leading end of the electrically conductive wire around the edge of the hole until the leading end of the electrically conductive wire engages the side of the hole and is substantially perpendicular to the bus plate to plant the leading end of the electrically conductive wire firmly in the hole.

13. The method of defined in claim 12 wherein the trailing end of the electrically conductive wire is planted in or adjacent to one of the holes by;

paying the electrically conductive wire out past the hole, and shearing the electrically conductive wire so that the cut-off trailing end of the electrically conductive wire is bent down into the hole and the base adjacent the hole to plant the cut-off trailing end of the electrically conductive wire firmly in the base of the bus insulation plate.

14. The method as defined in claim 13 wherein a wedge shaped cutter blade is used in planting the leading end of the electrically conductive wire and in shearing and planting the trailing end of the electrically conductive wire.

* * * * *